(12) United States Patent
Yang et al.

(10) Patent No.: US 10,570,008 B2
(45) Date of Patent: Feb. 25, 2020

(54) SENSING DEVICE

(71) Applicant: SILICON INTEGRATED SYSTEMS CORP., Hsinchu (TW)

(72) Inventors: Ssu-Che Yang, Hsinchu (TW); Wen-Chi Lin, Hsinchu (TW); Keng-Nan Chen, Hsinchu (TW)

(73) Assignee: SILICON INTEGRATED SYSTEMS CORP., Hsinchu (TW)

( * ) Notice: Subject to any disclaimer, the term of this patent is extended or adjusted under 35 U.S.C. 154(b) by 433 days.

(21) Appl. No.: 15/668,844

(22) Filed: Aug. 4, 2017

(65) Prior Publication Data
US 2018/0127264 A1 May 10, 2018

(30) Foreign Application Priority Data
Nov. 4, 2016 (TW) .............................. 105135898 A

(51) Int. Cl.
*B81B 7/00* (2006.01)
*B81B 7/04* (2006.01)
*H04R 3/04* (2006.01)
*G01R 17/04* (2006.01)
*H02M 3/07* (2006.01)

(52) U.S. Cl.
CPC .............. *B81B 7/008* (2013.01); *G01R 17/04* (2013.01); *H04R 3/04* (2013.01); *B81B 2201/02* (2013.01); *H02M 3/07* (2013.01); *H04R 2201/003* (2013.01); *H04R 2410/00* (2013.01)

(58) Field of Classification Search
CPC ...... B81B 7/008; B81B 2201/02; G01R 17/04; B04R 3/04; H02M 3/07; H04R 2201/003; H04R 2410/00
See application file for complete search history.

(56) References Cited

U.S. PATENT DOCUMENTS

| | | | |
|---|---|---|---|
| 8,094,839 B2 * | 1/2012 | Lee ...................... | G01H 11/06 381/104 |
| 9,338,546 B2 * | 5/2016 | Straeussnigg ............ | H04R 3/00 |
| 10,273,151 B2 * | 4/2019 | Lin ........................... | B81B 7/02 |

* cited by examiner

*Primary Examiner* — Dinh T Le
(74) *Attorney, Agent, or Firm* — Maschoff Brennan

(57) ABSTRACT

A sensing device includes a micro-electromechanical sensor, a source follower and an amplifier. The source follower includes a first output module including a first transistor and a second transistor. The micro-electromechanical sensor is configured to generate an input signal. A first terminal of the first transistor is configured to receive a first reference voltage. A second terminal and a control of the first transistor are electrically connected to the first output terminal and to a first current source respectively. A first terminal and a second terminal of the second transistor are electrically connected to the second terminal and the control terminal of the first transistor respectively. A control terminal of the second transistor is configured to receive the input signal. A first input terminal and a second input terminal of the amplifier are electrically connected to a first output terminal configured to receive a common-mode voltage respectively.

9 Claims, 7 Drawing Sheets

US 10,570,008 B2

SENSING DEVICE

CROSS-REFERENCE TO RELATED APPLICATIONS

This non-provisional application claims priority under 35 U.S.C. § 119(a) on Patent Application No(s). 105135898 filed in Taiwan, R.O.C. on Nov. 4, 2016, the entire contents of which are hereby incorporated by reference.

TECHNICAL FIELD

The disclosure relates to a sensing device, more particularly to a sensing device having an Micro-electromechanical sensor.

BACKGROUND

Micro Electro Mechanical System (MEMS) is an industrial technology combining the techniques of micro-electronics and mechanical engineering. Generally, the size of MEMS is within the range between micrometers (μm) and micrometers (mm). MEMS are generally manufactured using the technique of processing semiconductors, which includes silicon processing methods, such as calendering, electroplating, wet etching, dry etching and electrical discharge machining, etc.

General physical experiences are not available when the size of MEMS is under consideration. For example, since the ratio of area to volume of MEMS is much less than those of normal mechanical systems, the surface phenomenon of MEMS is much more important than the volume phenomenon of MEMS. In other words, due to the physical characteristics caused by the ratio of size, the effects caused by the noise should be considered seriously for back-end circuits of MEMS.

SUMMARY

A sensing device is disclosed according to one embodiment of the present disclosure. The sensing device includes a micro-electromechanical sensor, a source follower and an amplifier. The source follower includes a first output module. The first output module includes a first transistor and a second transistor. The micro-electromechanical sensor is configured to generate an input signal according to a change of an environment. A first terminal of the first transistor is for receiving a first reference voltage, a second terminal of the first transistor is electrically connected to a first output terminal, and a control terminal of the first transistor is electrically connected to a first current source. A first terminal of the second transistor is electrically connected to the second terminal of the first transistor, a second terminal of the second transistor is electrically connected to the control terminal of the first transistor, and a control terminal of the second transistor is configured to receive the input signal. Both of the second transistor and the first transistor are P-type transistors or N-type transistors. A first input terminal of the amplifier is electrically connected to the first output terminal, and a second input terminal of the amplifier is configured to receive a common-mode voltage. The common-mode voltage is related to the first reference voltage and is independent upon a voltage of the first output terminal. A voltage of the output terminal of the amplifier is related to a difference between the voltage of the first output terminal and the common-mode voltage.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
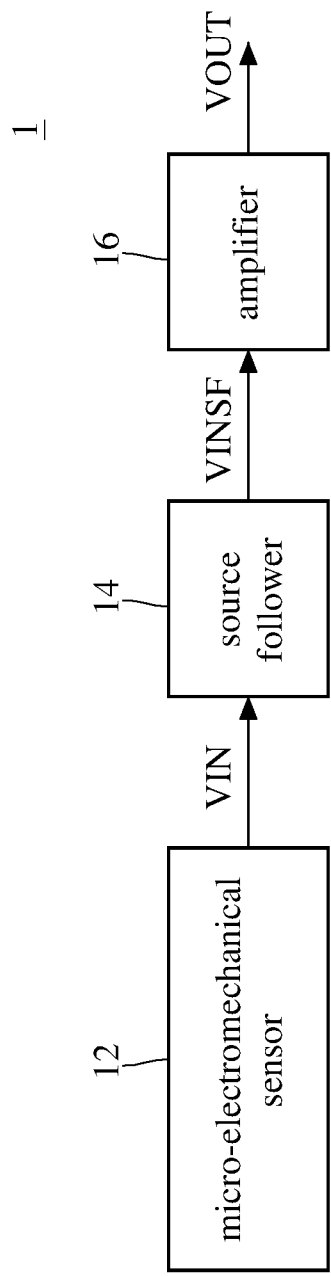
FIG. 1 is a block diagram of a sensing device according to one embodiment of the present disclosure.

Please refer to FIG. 1, which is a block diagram of a sensing device according to one embodiment of the present disclosure. As shown in FIG. 1, a sensing device 1 has a micro-electromechanical sensor 12, a source follower 14 and an amplifier 16. The micro-electromechanical sensor 12 is configured to generate an input signal VIN according to a change of an environment. The source follower 14 is configured to adjust front-end circuits of the amplifier 16 for providing equivalent output impedances to the amplifier 16. The source follower 14 is configured to generate a following signal VINSF according to the input signal VIN. The amplifier 16 is configured to amplify the following signal VINSF for generating an output signal VOUT. In one example, the micro-electromechanical sensor 12 can be used for detecting a change in a physical quantity sourced from the environment such as sounds, speeds, temperature or pressure of said environment for generating the input signal VIN. The above embodiments are just for illustrating only, and the present disclosure is not limited to the above embodiments.

Figure 2:
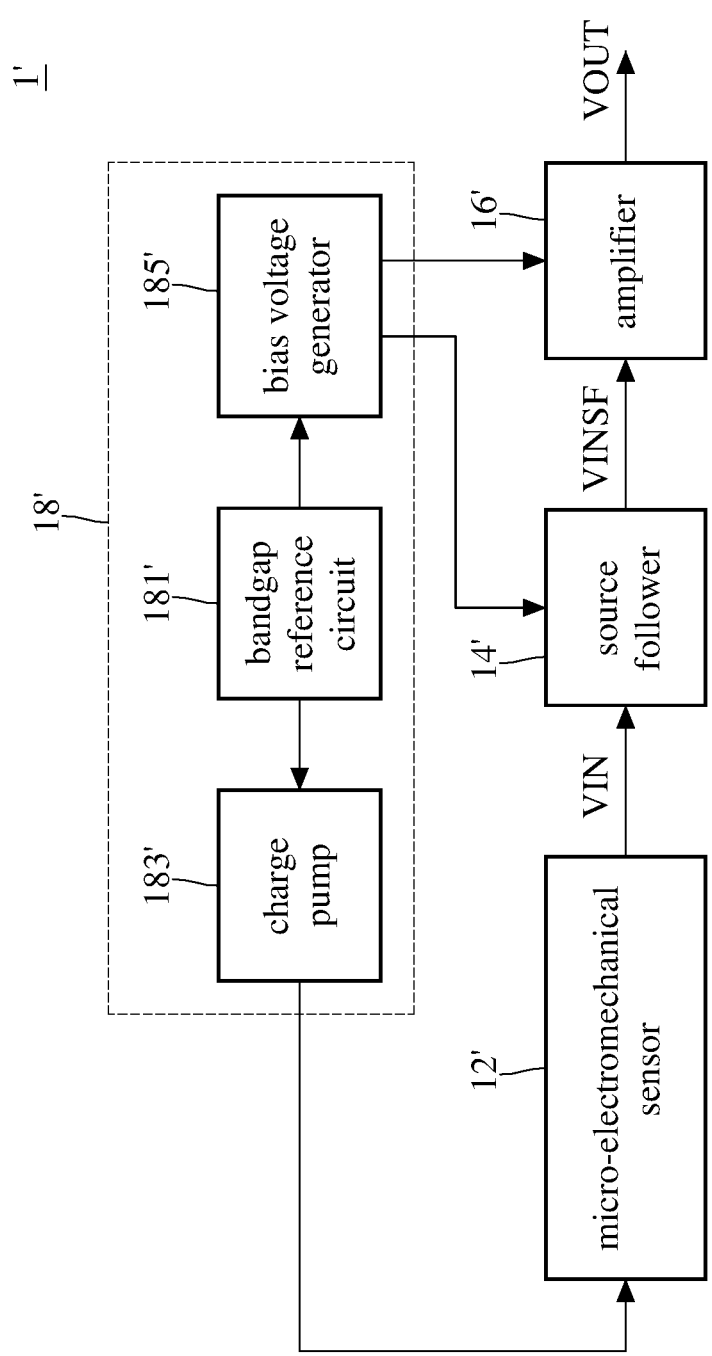
FIG. 2 is a block diagram of a sensing device according to another embodiment of the present disclosure.

When the micro-electromechanical sensor 12 is configured to detect a variety of changes of an environment, the sensing device further has other function modules. The following embodiment shows a structure of the sensing device 1 as a MEMS microphone. Please refer to FIG. 2, which is a block diagram of a sensing device according to another embodiment of the present disclosure. As shown in FIG. 2, the sensing device 1' further has a power module 18'. The power module 18' has a bandgap reference circuit 181', a charge pump 183' and a bias voltage generator 185'. The bandgap reference circuit 181' is electrically connected to the charge pump 183' and the bias voltage generator 185'. The charge pump 183' is electrically connected to the micro-electromechanical sensor 12', and the bias voltage generator 185' is electrically connected to the source follower 14' and the amplifier 16'. The bandgap reference circuit 181' is configured to provide an accurate system reference voltage to the charge pump 183' and the bias voltage generator 185'. The charge pump 183' is configured to generate a high voltage for the micro-electromechanical sensor 12' according to the system reference voltage. The bias voltage generator 185' is configured to provide current to the source follower 14' and the amplifier 16' according to the system reference voltage. The detailed structures of the bandgap reference circuit 181', the charge pump 183', and the bias voltage generator 185' could be modified by persons having ordinary skills in the art according to actual demands, so no more repeated.

Figure 3:
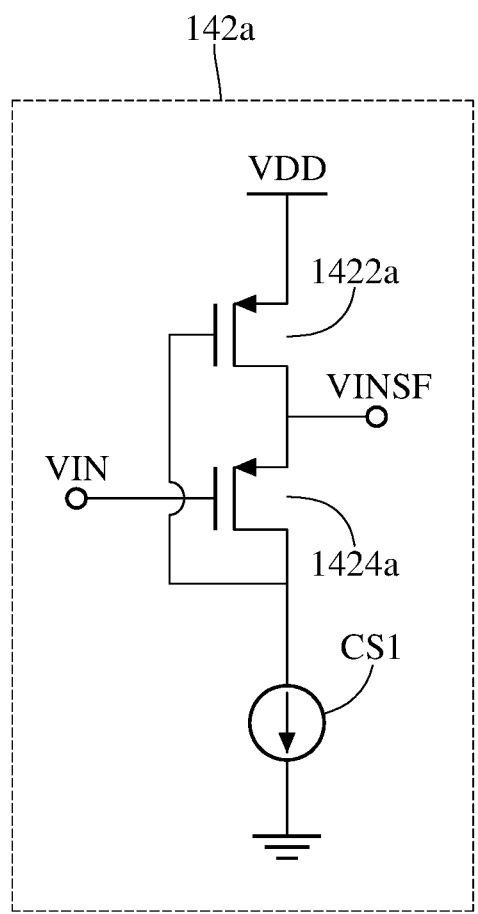
FIG. 3 is a circuit diagram of a source follower according to one embodiment of the present disclosure.

Please further refer to FIG. 3 for illustrating the source follower of the sensing device of the present disclosure. FIG. 3 is a circuit diagram of a source follower according to one embodiment of the present disclosure. As shown in FIG. 3, a source follower 14a has a first output module 142a having a first transistor 1422a and a second transistor 1424a. A first terminal of the first transistor 1422a is configured to receive a first reference voltage VDD. A second terminal of the first transistor 1422a is electrically connected to a first output terminal N1. A control terminal of the first transistor 1422a is electrically connected to a first current source CS1. A first terminal of the second transistor 1424a is electrically connected to the second terminal of the first transistor 1422a. A second terminal of the second transistor 1424a is electrically connected to the control terminal of the first transistor 1422a. A control terminal of the second transistor 1424a is configured to receive the input signal VIN. The first output module 142a of the source follower 14a is configured to provide the following signal VINSF to back-end circuits through the first output terminal N1.

In this embodiment, the first reference voltage VDD is a relatively high voltage in the system. The first current source CS1 is a current source providing a constant current. In the present disclosure, the practical structure of the first current source CS1 is not limited. In the embodiment, both of the second transistor 1424a and the first transistor 1422a are P-type transistors or N-type transistors, but the present disclosure is not limited to the embodiment. By using the circuit structure of the present disclosure, the output impedance of the source follower of the sensing device could be significantly decreased. According to features of circuits, the output impedance of a traditional source follower is generally greater than 100K Ohms, but the output impedance of the source follower in FIG. 3 is less than 1K Ohms.

Figure 4:
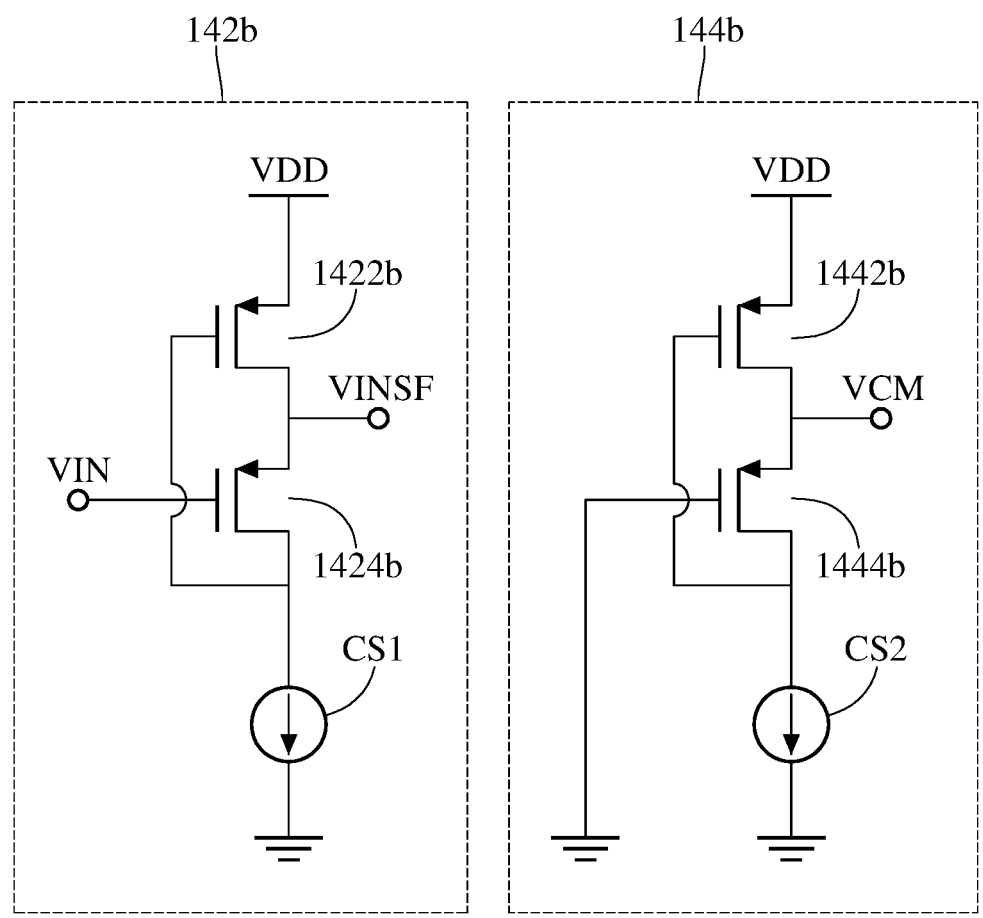
FIG. 4 is a circuit diagram of a source follower according to another embodiment of the present disclosure.

Please refer to FIG. 4 for illustrating the source follower of the sensing device. FIG. 4 is a circuit diagram of a source follower according to another embodiment of the present disclosure. Comparing to FIG. 3, in the embodiment of FIG. 4, a source follower 14b further includes a second output module 144b. The second output module 144b has a third transistor 1442b and a fourth transistor 1444b. A first terminal of the third transistor 1442b is configured to receive the first reference voltage VDD. A second terminal of the third transistor 1442b is electrically connected to a second output terminal N2. A control terminal of the third transistor 1442b is electrically connected to a second current source CS2. A first terminal of the fourth transistor 1444b is electrically connected to the second terminal of the third transistor 1442b. A second terminal of the fourth transistor 1444b is electrically connected to the control terminal of the third transistor 1442b. A control terminal of the fourth transistor 1444b is configured to receive a second reference voltage. In the embodiment, the second reference voltage could be a ground voltage.

The second output module 144b is configured to provide common-mode voltage VCM through the second output terminal N2 for back-end circuits to eliminate common-mode bias or to perform other computations. In this embodiment, all of the first transistor 1422b, the second transistor 1424b, the third transistor 1442b and the fourth transistor 1444b are N-type transistors or P-type transistors. Moreover, the second current source CS2 is a current source providing a constant current. The practical structure of the second current source CS2 is not limited. In this embodiment, the intensity of the output current from the first current source CS1 is the same as the intensity of the output current from the second current source CS2.

Figure 5:
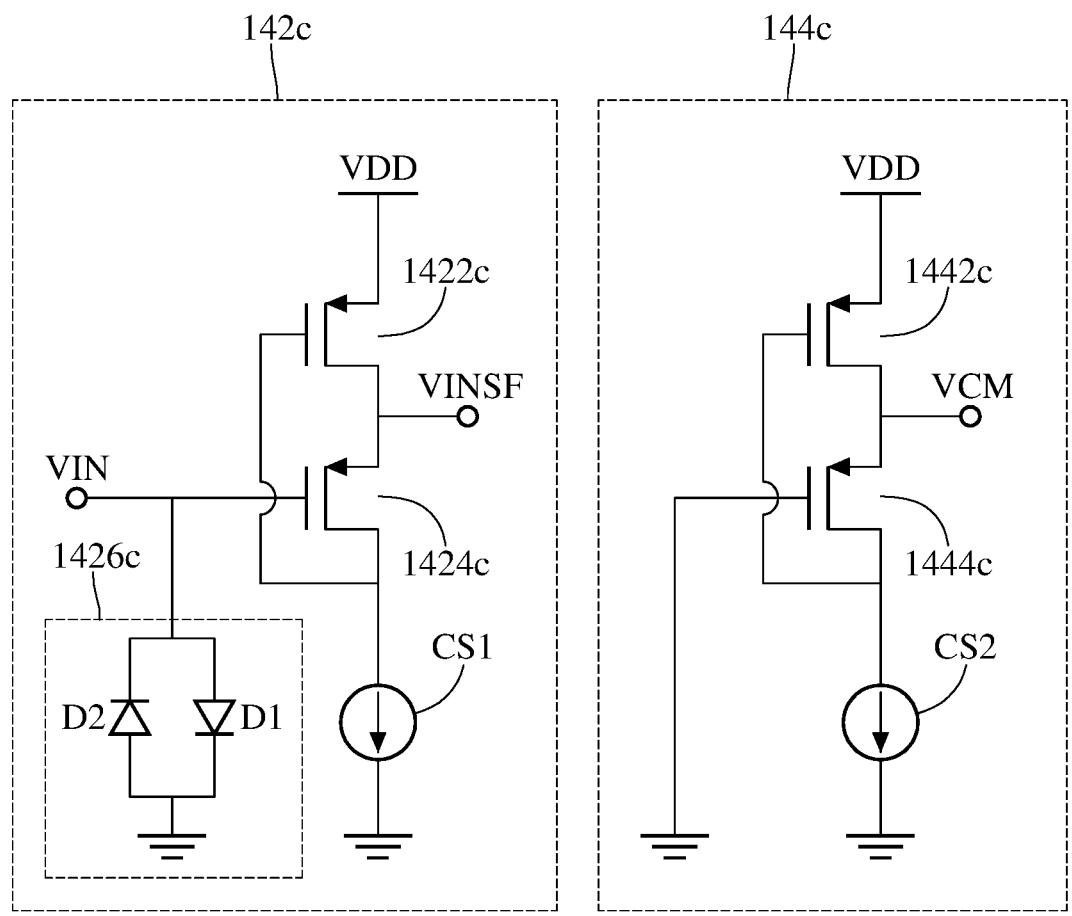
FIG. 5 is a circuit diagram of a source follower according to further another embodiment of the present disclosure.

Please further refer to FIG. 5, which is a circuit diagram of a source follower according to further another embodiment of the present disclosure. In the embodiment of FIG. 5, the first output module 1 further includes a first bias unit 1426c. The first bias unit 1426c is electrically connected between a control terminal of the second transistor 1424c and a terminal providing the second reference voltage. In one example, the second reference voltage is a ground voltage. However, the present disclosure is not limited to this example. In this embodiment, the first bias unit 1426c includes a first diode D1 and a second diode D2. An anode end of the first diode D1 and a cathode end of the second diode D2 are electrically connected to a control terminal of the second transistor 1424c. A cathode end of the first diode D1 is electrically connected to an anode end of the second diode D2. The cathode end of the first diode D1 and the anode end of the second diode D2 are configured to receive the second reference voltage. From another point of view, the first bias unit 1426c, as an anti-parallel diode pair, is a high impedance unit connecting between the terminals respectively providing the input signal VIN and the second reference voltage. In one example, the second reference voltage is a ground voltage. Both of the first diode D1 and the second diode D2 are poly-silicon diodes.

Figure 6:
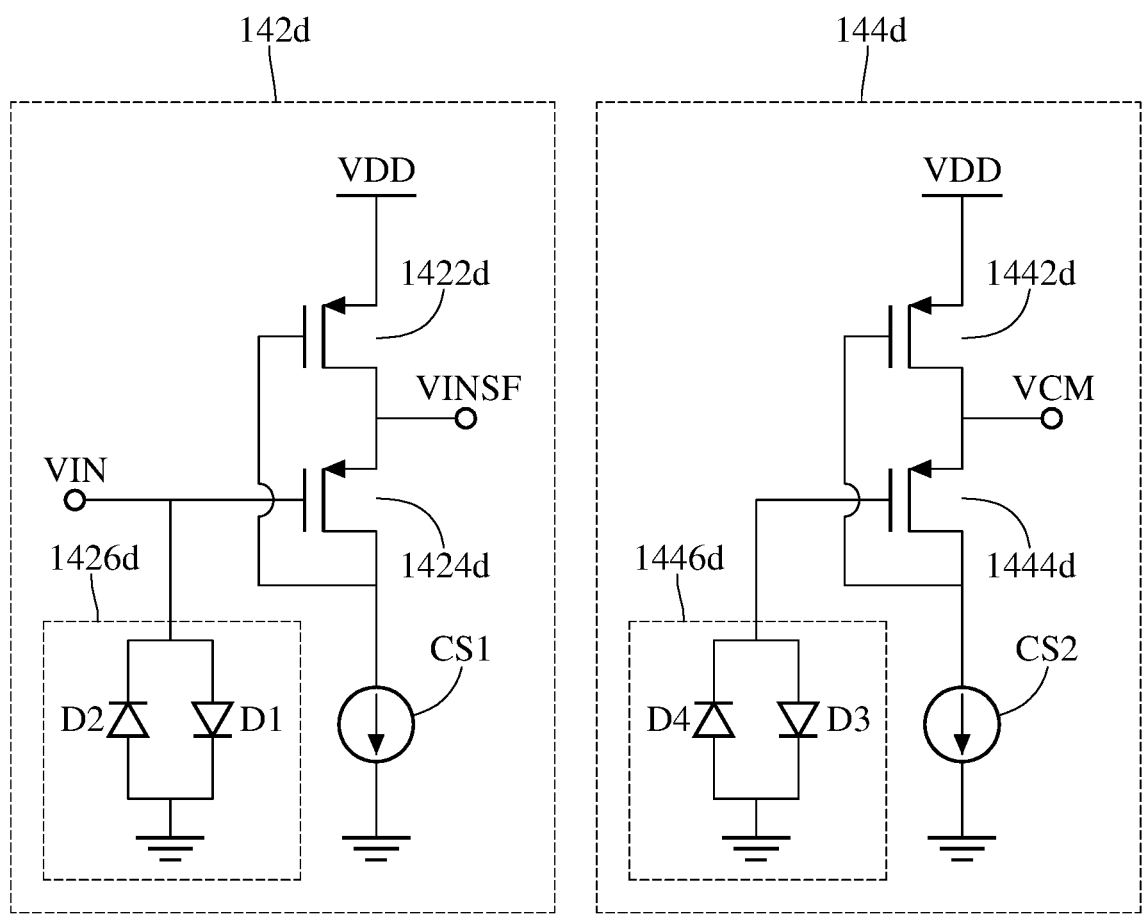
FIG. 6 is a circuit diagram of a source follower according to further another embodiment of the present disclosure.

Please further refer to FIG. 6, which is a circuit diagram of a source follower according to further another embodiment of the present disclosure. In the embodiment of FIG. 6, the second output module 144d further includes a second bias unit 1446d. The second bias unit 1446d is electrically connected between a control terminal of the fourth transistor 1444d and a terminal providing the second reference voltage. In this embodiment, the second bias unit 144c includes a third diode D3 and a fourth diode D4. Similarly, an anode end of the third diode D3 and a cathode end of the fourth diode D4 are electrically connected to a control terminal of the fourth transistor 1444c. A cathode end of the third diode D3 is electrically connected to an anode end of the fourth diode D4. The cathode end of the third diode D3 and the anode end of the fourth diode D4 are configured to receive the second reference voltage. All of the first diode D1, the second diode D2, the third diode D3 and the fourth diode D4 are poly-silicon diodes.

Figure 7:
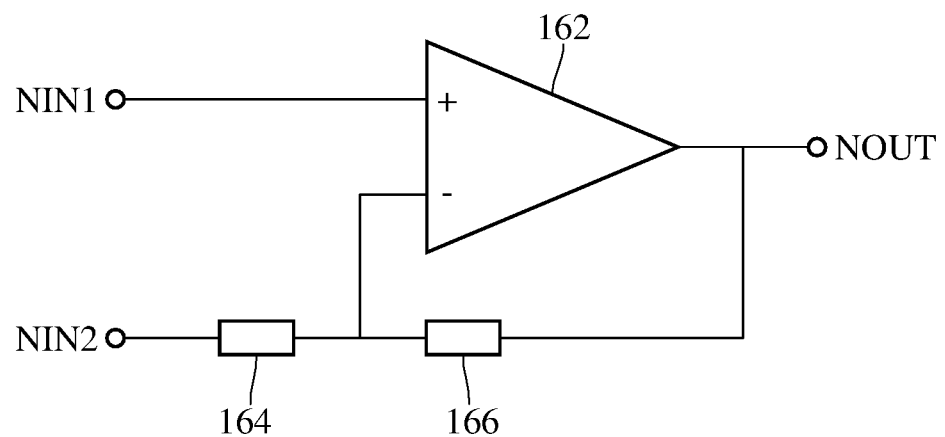
FIG. 7 is a circuit diagram of an amplifier according to one embodiment of the present disclosure.

In the embodiment of FIG. 1, the amplifier 16 could be constructed as a non-inverting amplifier using an operational amplifier and at least one resistor. Please refer to FIG. 7 for illustrating possible embodiments of the amplifier. FIG. 7 is a circuit diagram of an amplifier according to one embodiment of the present disclosure. A first input terminal NIN1 of the amplifier 16 is electrically connected to the first input terminal N1 of the source follower 14 for receiving the following signal VINSF. A second input terminal NIN2 of the amplifier 16 is configured to receive the common-mode voltage VCM. The common-mode voltage could be received from the second output module of the source follower. The voltage of the output terminal of the amplifier 16 is related to a difference between the voltage of the following signal VINSF and the common-mode voltage VCM.

More specifically, the amplifier 16 has an operational amplifier 162 and resistors 164, 166. The resistor 164 is electrically connected between the inverting input terminal of the operational amplifier 162 and the second input terminal NIN2. The resistor 166 is electrically connected between the inverting input terminal of the operational amplifier 162 and the output terminal NOUT of the amplifier 16. Based on the structure, the resistance values of the resistors of the amplifier 16 are set corresponding to the output impedance of the source follower 14. Therefore, when the output impedance of the source follower 14 is increased, the resistance values of the resistors 164, 166 of the amplifier 16 would have to be raised correspondingly. Since the thermal noises of the resistors 164, 166 are related to the resistance values of the resistors 164, 166, the thermal noises or the noise power would be increased as the resistance values of the resistors 164, 166 are increased. The noise compositions of the output signal of the amplifier 16 would be different when the structure of the amplifier 16 is changed. In the embodiment of FIG. 6, raising the resistance values of the resistors 164, 166 is equivalent to raise the noise power of the output signal of the amplifier 16. Relative models could be inferred by persons having ordinary skills in the art, so no more repeated here. The output impedance of the source follower in the aforementioned embodiments of the present disclosure is much less than the output impedance of the conventional source follower. In other words, the resistors 164, 166 of the amplifier 16 could have low resistance values.

Based on the above descriptions, the present disclosure provides a sensing device having a micro-electromechanical sensor, a source follower and an amplifier. The source follower is electrically connected to the amplifier. Therefore, the input impedance of the amplifier matches the output impedance of the source follower. Since the traditional source follower has high output impedance, the amplifier must have high input impedance. In this condition, the output noise of the amplifier would be raised. In the sensing device of the present disclosure, the components in the source follower are connected in the way that makes the source follower have significantly low output impedance. Thereby, the amplifier electrically connected to the output terminal of the source follower does not need to use resistors having high resistance. Therefore, the noise of output signals of the amplifier could be reduced.

What is claimed is:

1. A sensing device, comprising:
   a micro-electromechanical sensor configured to generate an input signal according to a change of an environment;
   a source follower comprising a first output module, with the first output module comprising:
      a first transistor having a first terminal, a second terminal and a control terminal, with the first terminal of the first transistor receiving a first reference voltage and the second terminal of the first transistor electrically connected to a first output terminal, and the control terminal of the first transistor electrically connected to a first current source; and
      a second transistor having a first terminal, a second terminal and a control terminal, with the first terminal of the second transistor electrically connected to the second terminal of the first transistor, the second terminal of the second transistor electrically connected to the control terminal of the first transistor, and the control terminal of the second transistor configured to receive the input signal, wherein both of the second transistor and the first transistor are P-type transistors or N-type transistors; and
   an amplifier having a first input terminal, a second input terminal and an output terminal, with the first input terminal of the amplifier electrically connected to the first output terminal, the second input terminal of the amplifier configured to receive a common-mode voltage, wherein the common-mode voltage is related to the first reference voltage and is independent upon a voltage of the first output terminal, and a voltage of the output terminal of the amplifier is related to a difference between the voltage of the first output terminal and the common-mode voltage.

2. The sensing device according to claim 1, wherein the first output module further comprises a first bias unit electrically connected between the control terminal of the second transistor and a terminal providing a second reference voltage.

3. The sensing device according to claim 2, wherein the first bias unit comprises a first diode and a second diode, an anode end of the first diode and a cathode end of the second diode are electrically connected to the control terminal of the second transistor, a cathode end of the first diode is electrically connected to an anode end of the second diode, and the cathode end of the first diode and the anode end of the second diode are configured to receive the second reference voltage.

4. The sensing device according to claim 3, wherein the first diode and the second diode are poly-silicon diodes.

5. The sensing device according to claim 1, wherein the source follower further comprises a second output module, with the second output module comprising:
   a third transistor having a first terminal, a second terminal and a control terminal, with the first terminal of the third transistor configured to receive the first reference voltage, the second terminal of the third transistor electrically connected to a second output terminal, and the control terminal of the third transistor electrically connected to a second current source; and
   a fourth transistor having a first terminal, a second terminal and a control terminal, with the first terminal of the fourth transistor electrically connected to the second terminal of the third transistor, the second terminal of the fourth transistor electrically connected to the control terminal of the third transistor, and the control terminal of the fourth transistor configured to receive a second reference voltage;
   wherein the second output module is configured to provide the common-mode voltage through the second output terminal, and all of the first transistor, the second transistor, the third transistor and the fourth transistor are N-type transistors or P-type transistors.

6. The sensing device according to claim 5, wherein an intensity of an output current from the first current source is the same as an intensity of an output current from the second current source.

7. The sensing device according to claim 5, wherein the first output module further comprises a first bias unit, the second output module further comprises a second bias unit, the first bias unit is electrically connected between the control terminal of the second transistor and a terminal providing the second reference voltage, and the second bias unit is electrically connected between the control terminal of the fourth transistor and the terminal providing the second reference voltage.

8. The sensing device according to claim 7, wherein the first bias unit comprises a first diode and a second diode, the second bias unit comprises a third diode and a fourth diode, an anode end of the first diode and an cathode end of the second diode are electrically connected to the control terminal of the second transistor, a cathode end of the first diode is electrically connected to an anode end of the second diode, the cathode end of the first diode and the anode end of the second diode are configured to receive the second reference voltage, an anode end of the third diode and an cathode end of the fourth diode are electrically connected to the control terminal of the fourth transistor, a cathode end of the third diode is electrically connected to an anode end of the fourth diode, and the cathode end of the third diode and the anode end of the fourth diode are configured to receive the second reference voltage.

9. The sensing device according to claim 8, wherein all of the first diode, the second diode, the third diode and the fourth diode are poly-silicon diodes.

* * * * *